(12) United States Patent
Wang et al.

(10) Patent No.: US 11,330,734 B2
(45) Date of Patent: May 10, 2022

(54) CASE ASSEMBLY AND ELECTRONIC DEVICE

(71) Applicant: HTC CORPORATION, Taoyuan (TW)

(72) Inventors: Chih-Kuang Wang, Taoyuan (TW);
Chin Kai Sun, Taoyuan (TW);
Chun-Lung Chu, Taoyuan (TW);
Tung-Hsin Yeh, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 74 days.

(21) Appl. No.: 16/886,108

(22) Filed: May 28, 2020

(65) Prior Publication Data

US 2021/0378135 A1 Dec. 2, 2021

(51) Int. Cl.
*H05K 7/20* (2006.01)
*H05K 5/04* (2006.01)

(52) U.S. Cl.
CPC ........... *H05K 7/20136* (2013.01); *H05K 5/04* (2013.01); *H05K 7/20436* (2013.01); *H05K 7/20518* (2013.01)

(58) Field of Classification Search
CPC ........... H05K 7/20436; H05K 7/20518; H05K 7/20136
See application file for complete search history.

(56) References Cited

U.S. PATENT DOCUMENTS

| 2016/0088762 A1* | 3/2016 | Wu ..................... | H05K 7/20336 |
| | | | 361/700 |
| 2016/0181688 A1* | 6/2016 | Gu ......................... | H01Q 1/242 |
| | | | 343/702 |
| 2016/0302330 A1* | 10/2016 | Hamari ................ | H02M 7/003 |

FOREIGN PATENT DOCUMENTS

| TW | M511068 U | 10/2015 |
| TW | I598726 B | 9/2017 |
| WO | 2017/008443 A1 | 1/2017 |

OTHER PUBLICATIONS

Machine Translation for TW I598726B, "portable electronic product and heat dissipating casing structure" 6 pages, translated on Oct. 26, 2021 (Year: 2017).*
Chinese language office action dated May 7, 2021, issued in application No. TW 109134217.

* cited by examiner

*Primary Examiner* — Hung V Ngo
(74) *Attorney, Agent, or Firm* — McClure, Qualey & Rodack, LLP

(57) ABSTRACT

A case assembly and an electronic device are provided. The case assembly includes a metal case and a plastic cladding body. The metal case includes an inner side and an outer side, the inner side is opposite to the outer side. The metal case further includes a channel which is concavely disposed on the inner side to divide the inner side into a plurality of thermal insulation areas. The plastic cladding body is disposed on the metal case, and completely covers the outer side of the metal case. The electronic device includes a case assembly and a plurality of heart sources. The heart sources are corresponded to the thermal insulation areas on the inner side of the metal case respectively. Thus, the case assembly and the electronic device are able to prevent the heat produced from elements effect each other.

8 Claims, 6 Drawing Sheets

CASE ASSEMBLY AND ELECTRONIC DEVICE

BACKGROUND OF THE INVENTION

Field of the Invention

The present invention relates to a case assembly and an electronic device with a heat dissipation structure, and in particular, relates to a case assembly with a plurality of thermal insulation areas and an electronic device comprising the case assembly.

Descriptions of the Related Art

As shown in FIG. 1A and FIG. 1B, many electronic devices adopt a case 2 containing metal in consideration of structural strength, rigidity or attracting attention of consumers. The case 2 made of metal can conduct the heat generated by heat sources 4 (e.g., chips) in the electronic device to the outside quickly, but it is easy for heat sources to form a high-temperature hot spot P on the surface of the case 2. When the user touches the high-temperature hot spot P while holding the case 2, he/she may feel uncomfortable or doubt whether there is a problem with the electronic device.

Additionally, as shown in FIG. 2A and FIG. 2B, there are usually a plurality of heat sources 4 in an electronic device, and the heat generated by one heat source (chip) 4 is easily transmitted to another heat source (chip) 4 or other electronic elements along the case 2 made of metal, which may cause overheat of the chip and deteriorate the performance thereof.

Given that it is easier to generate a large amount of heat due to the increasing efficiency of electronic devices, heat dissipation management is more important.

SUMMARY OF THE INVENTION

An objective of the present invention is to provide a case assembly and an electronic device with a heat dissipation structure. The case assembly has a plurality of thermal insulation areas to avoid or reduce the influence caused by heat sources in the electronic device.

To achieve the aforesaid objective, a case assembly provided by the present invention comprises a metal case and a plastic cladding body. The metal case comprises an inner side and an outer side, and the inner side is opposite to the outer side. The metal case further comprises a channel which is concavely disposed on the inner side to divide the inner side into a plurality of thermal insulation areas. The plastic cladding body is disposed on the metal case, and completely covers the outer side of the metal case.

An electronic device provided by the present invention may comprise a case assembly and a plurality of heat sources. The case assembly comprises a metal case and a plastic cladding body. The metal case comprises an inner side and an outer side, and the inner side is opposite to the outer side. The case assembly further comprises a channel which is concavely disposed on the inner side to divide the inner side into a plurality of thermal insulation areas. The plastic cladding body is disposed on the metal case, and completely covers the outer side of the metal case. The plurality of heat sources correspond to the plurality of thermal insulation areas on the inner side of the metal case respectively.

In an embodiment, the channel of the metal case comprised in the case assembly of the present invention further penetrates through the outer side.

In an embodiment, the plastic cladding body comprised in the case assembly of the present invention comprises a thermal barrier portion which is disposed in the channel.

In an embodiment, the case assembly of the present invention further comprises a fan, wherein the thermal barrier portion comprises a groove, and the fan is disposed in the groove.

In an embodiment, the thermal barrier portion comprised in the case assembly of the present invention protrudes from the inner side of the metal case.

In an embodiment, the case assembly of the present invention further comprises a thermal isolator, wherein the thermal isolator is disposed in the thermal barrier portion of the plastic cladding body.

In an embodiment, the case assembly of the present invention further comprises a thermal isolator, wherein the thermal isolator is disposed in the channel of the metal case.

In an embodiment, the case assembly of the present invention further comprises a fan, wherein the fan is disposed in the channel of the metal case.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Hereinafter, specific embodiments according to the present invention will be specifically described. However, the present invention may be practiced in many different forms of embodiments without departing from the spirit of the present invention, and the scope claimed in the present invention should not be interpreted as being limited to what stated in the specification.

Unless the context clearly indicates otherwise, singular forms "a" and "an" as used herein also include plural forms. In addition, the orientations (such as front, back, upper, lower, both sides, inside and outside, etc.) are relative orientations, which may be defined according to the use state of the electronic device or the case assembly, and do not indicate or imply that the electronic device or the case assembly needs to be constructed or operated in a specific direction, and the orientations should not be understood as limitation to the present invention.

The electronic device mentioned in the present invention may be a device such as a wearable controller of wireless communication products (mobile phones, tablets, computers, etc.), virtual reality (VR) game products or the like, and it comprises a case assembly and a plurality of heat sources (or called heating or temperature rising components). The case assembly is used as an outer cover or a shell of the electronic device, i.e., it forms an appearance of the electronic device, covers a plurality of internal elements of the electronic device (including the heat sources), and also has a heat dissipation structure. Here, the heat sources refer to components which make the ambient temperature higher than the environment temperature after the electronic device operates. These components may be for example chips, electronic elements, hard disks, batteries and other components in the electronic device that easily generate higher working temperature during operation, so that the skin of the user can obviously feel the heating point when contacting the product surface. In the following description, the cover-shaped case assembly is taken as an example to describe the technical content of each component and how the heat dissipation structure conducts the heat generated by the heat source out of the electronic device, without being limited thereto.

Figure 1A:
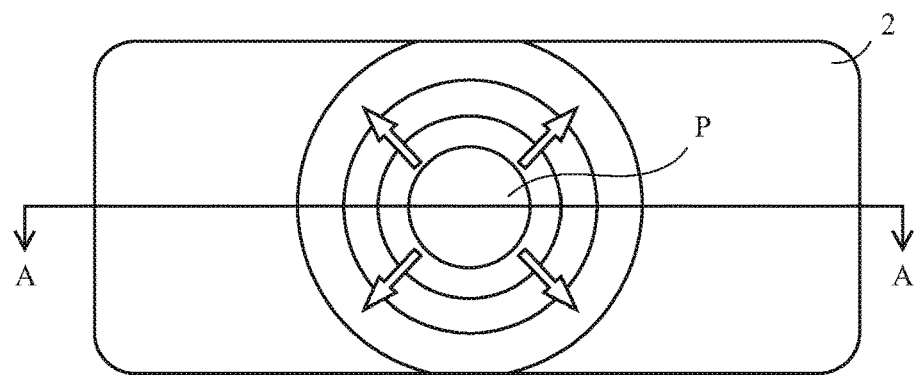
FIG. 1A and FIG. 1B are respectively schematic views of heat flow on the outer side of a conventional case assembly and along the section of A-A line thereof, when the heat source is in a heat generating state.
Figure 1B:
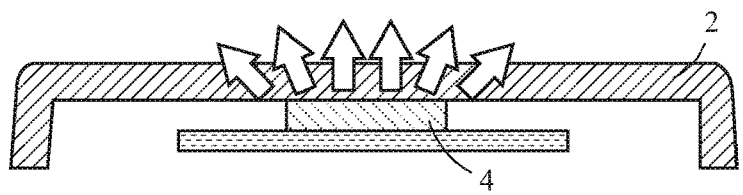
Figure 2A:
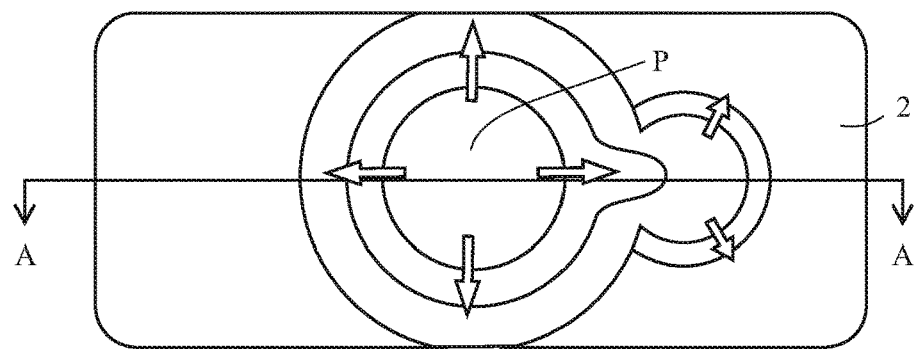
FIG. 2A and FIG. 2B are respectively schematic views of heat flow on the outer side of another conventional case assembly and along the section of A-A line thereof, when the heat source is in a heat generating state.
Figure 2B:
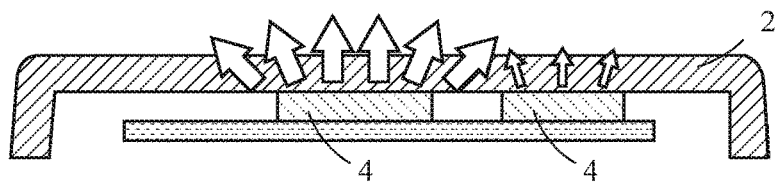
Figure 3A:
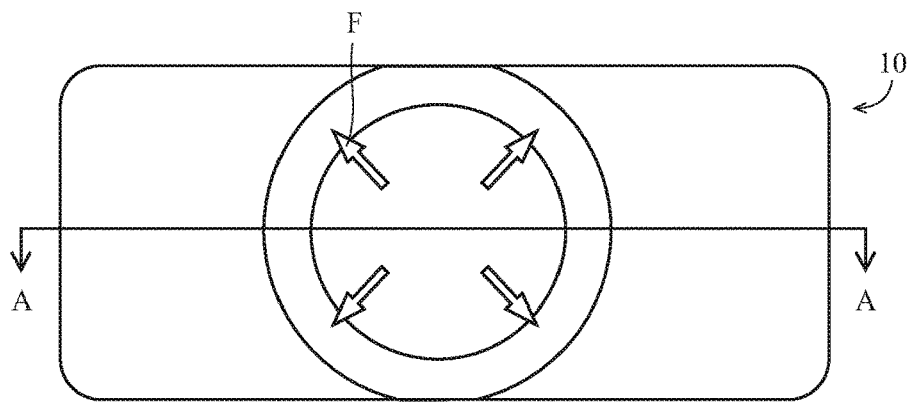
FIG. 3A and FIG. 3B are respectively schematic views of heat flow on the outer side of a case assembly and along the section of A-A line thereof according to a first preferred embodiment of the present invention.
Figure 3B:
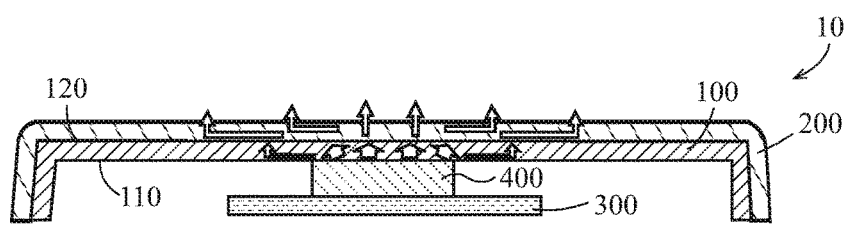

Referring to FIG. 3A to FIG. 3B, FIG. 3A to FIG. 3B are respectively schematic views of heat flow on the outer side of a case assembly 10 in the heat generating state and along the section of A-A line thereof according to a first preferred embodiment of the present invention, when the heat generated by the heat source is conducted to the case assembly 10 through the heat dissipation structure. The case assembly 10 may be used as a back cover of an electronic device for protection. The case assembly 10 comprises a metal cover 100 and a plastic cladding body 200, which may cover at least one substrate 300 and at least one chip 400 (i.e., the heat source) inside the electronic device (for clarity of illustration, all components are shown in an exaggerated scale, and the relative sizes and positions of components are not limited thereto).

The metal cover 100 has an inner side 110 and an outer side 120, and the inner side 110 is opposite to the outer side 120 and faces the chip 400. The inner side may be close to the chip 400, at a distance from the chip 400, or partially attached to the chip 400. The metal cover 100 may be formed into a lid body by die casting, or formed into a lid body by stamping a metal plate. The inner side 110 is characterized by a plurality of locking points, ribs, recesses or the like, and is not a completely smooth plane (not shown). For example, the plastic cladding body 200 is formed on the metal cover 100, e.g., a plastic (a raw material of the plastic cladding body 200) is formed on the metal cover 100 by overmolding or insert molding to completely cover an outer side 120 of the metal cover 100. Therefore, in a direction (e.g., a normal direction) of the outer side 120, the user can only observe and touch the plastic cladding body 200, but cannot observe and touch the outer side 120. Since the main purpose of the plastic cladding body 200 is not to increase the structural rigidity or strength of the case assembly 10, the plastic cladding body 200 as a whole is unnecessary to be too thick. Preferably, the plastic cladding body 200 may be thinner than the metal cover 100 to avoid the generation of a high-temperature hot spot. The plastic cladding body 200 may also partially cover the inner side 110 of the metal cover 100.

When the chip 400 generates a high temperature, the heat F is conducted to the metal cover 100 and then diffused outward. Since the coefficient of thermal conductivity of the plastic cladding body 200 is much lower than that of the metal cover 100, the heat F cannot be directly and quickly conducted to the outside by the plastic cladding body 200, so the heat F will first be conducted and diffused horizontally in the metal cover 100 and then gradually conducted to the plastic cladding body 200. Therefore, through the above heat dissipation design, the heat F will not be quickly concentrated on a certain point and then form a high-temperature hot spot on the outer surface of the case assembly 10, thereby avoiding uncomfortableness caused to the user.

Figure 4A:
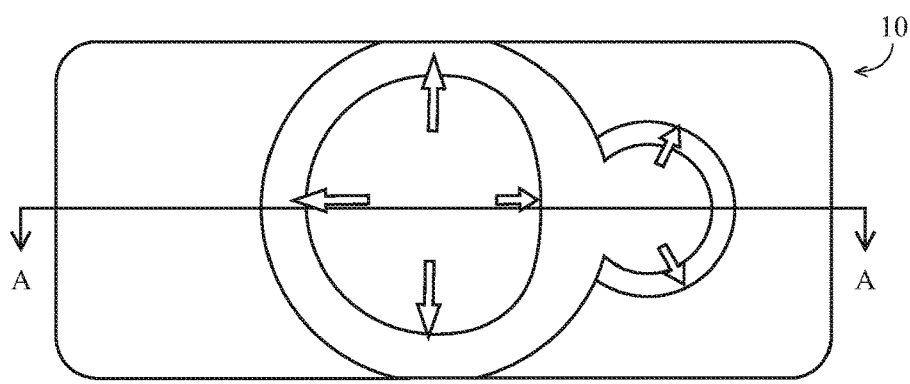
FIG. 4A and FIG. 4B are respectively schematic views of heat flow on the outer side of the case assembly and along the section of A-A line thereof according to the first preferred embodiment of the present invention.
Figure 4B:
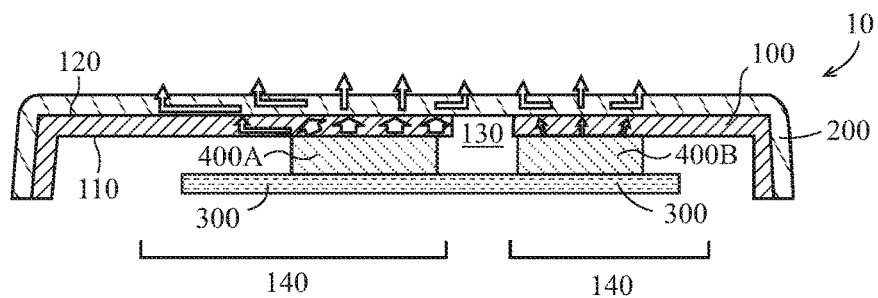

As shown in FIG. 4A to FIG. 4B, the metal cover 100 further comprises a channel 130, which is disposed on the inner side 110 and recessed from the inner side 100 to the outer side 120 by a depth which may be less than or equal to the thickness of the metal cover 100, i.e., not penetrating or penetrating to the outer side 120. In this way, the inner side 110 is divided into a plurality of thermal insulation areas 140. The arrangement of the channel 130 may make the thermal insulation areas 140 correspond to the positions of the chips (heat sources) 400A and 400B. Therefore, when the heat F generated by the chip 400A is conducted in the metal cover 100, it will be obstructed or blocked by the channel 130, and it is difficult to be transmitted to another chip 400B and thus will not affect the operation of other chips 400B or other elements.

Figure 5:
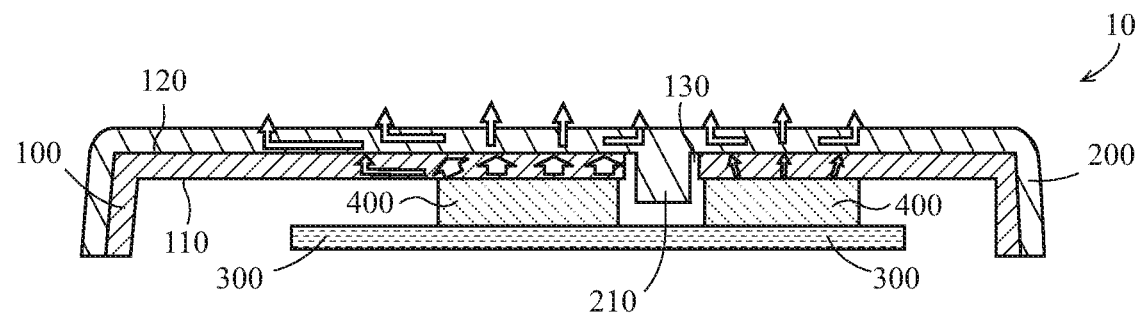
FIG. 5 is a schematic view of heat flow along the section of a case assembly according to a second preferred embodiment of the present invention (the thermal barrier portion is formed integrally with the plastic cladding body)

As shown in FIG. 5, in another preferred embodiment, the plastic cladding body 200 may further comprise a thermal barrier portion 210. The thermal barrier portion 210 may be a part of the plastic cladding body 200, formed integrally with the plastic cladding body 200, extended in the channel 130, and further extended between a plurality of chips 400 to prevent heat from affecting each other through air convection. The thermal barrier portion 210 may only fill a part of the channel 130 (the thickness of the thermal barrier portion 210 in the channel 130 is less than the depth of the channel 130), or completely fill the channel 130 (the thickness is the same as the depth), or further protrude from the channel 130 (the thickness is greater than the depth and protrudes from the inner side 110 of the metal cover 100). A width of the thermal barrier portion 210 may also be set to abut against or not abut against two cross sections (left and right sides of the channel 130) of the metal cover 100.

Figure 6:
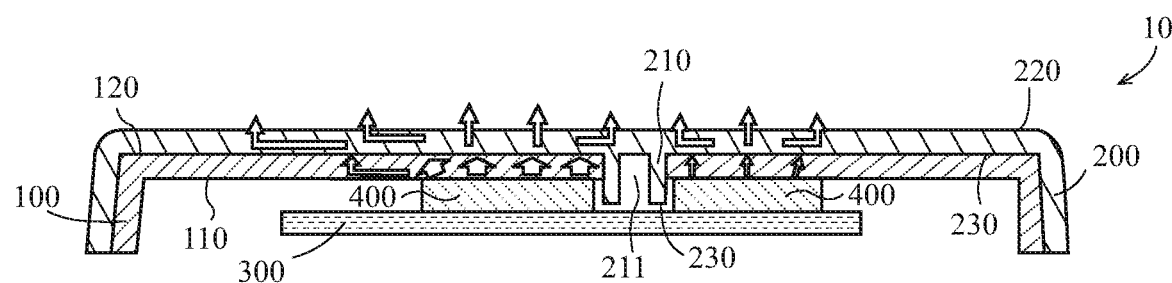
FIG. 6 is a schematic view of heat flow along the section of a case assembly according to a third preferred embodiment of the present invention (the heat barrier portion has a groove)

As shown in FIG. 6, in yet another preferred embodiment, the thermal barrier portion 210 may further comprise a groove 211. The groove 211 may extend from an inner surface 230 to an outer surface 220 of the plastic cladding body 200, but does not penetrate through the outer surface 220. There may be air in the groove 211 so that the coefficient of thermal conductivity of the thermal barrier portion 210 as a whole is lower.

Figure 7A:
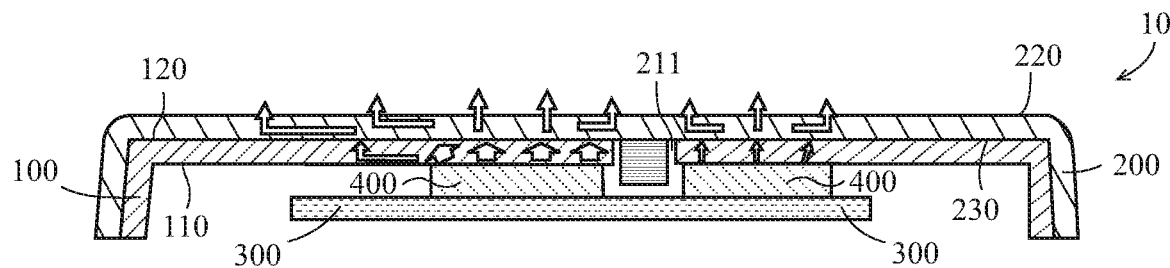
FIG. 7A to FIG. 7C are respectively schematic views of heat flow along the section of a case assembly according to a fourth preferred embodiment of the present invention (a thermal isolator is included)
Figure 7B:
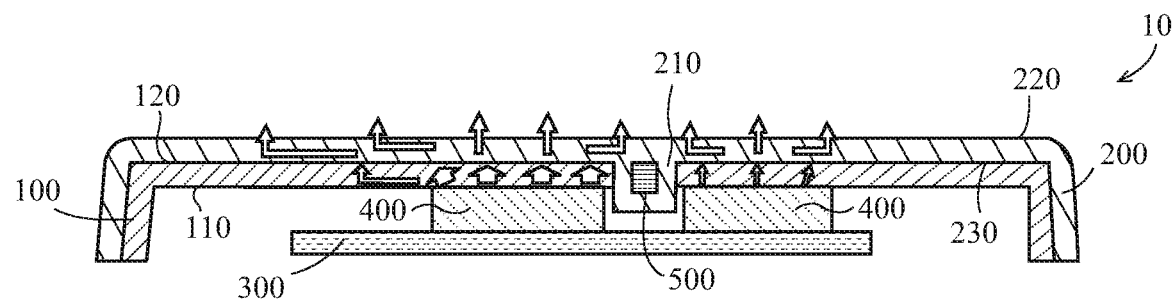
Figure 7C:
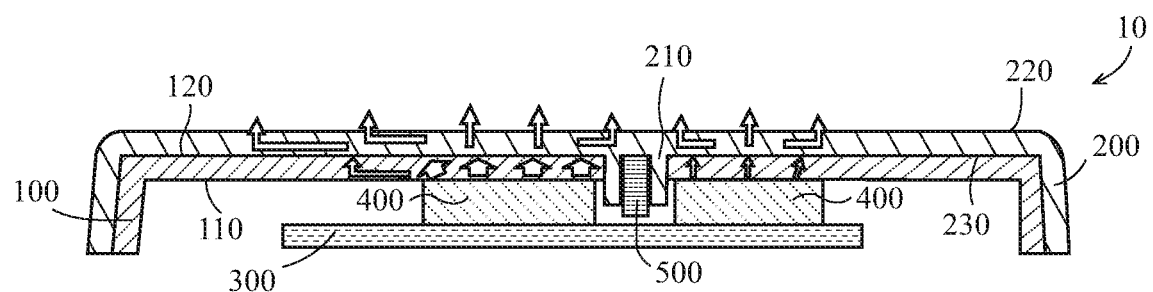

As shown in FIG. 7A to FIG. 7C, the case assembly 10 may further comprise a thermal isolator 500, and the thermal isolator 500 may be an independent component with respect to the plastic cladding body 200 (which is not integrally formed with the plastic cladding body 200) and may be a poor thermal conductor, such as foam, rubber or the like. The thermal isolator 500 may be independent of the plastic cladding body 200 and located in the channel 130 (as shown in FIG. 7A), or the thermal isolator 500 may be hermetically covered by the thermal barrier portion 210 and located in the channel 130 (as shown in FIG. 7B). In addition, the thermal isolator 500 may also be disposed in the groove 211 or further protrude from the groove 211 (as shown in FIG. 7B). Preferably, the coefficient of thermal conductivity of the thermal isolator 500 may be lower than that of the plastic cladding body 200.

Figure 8A:
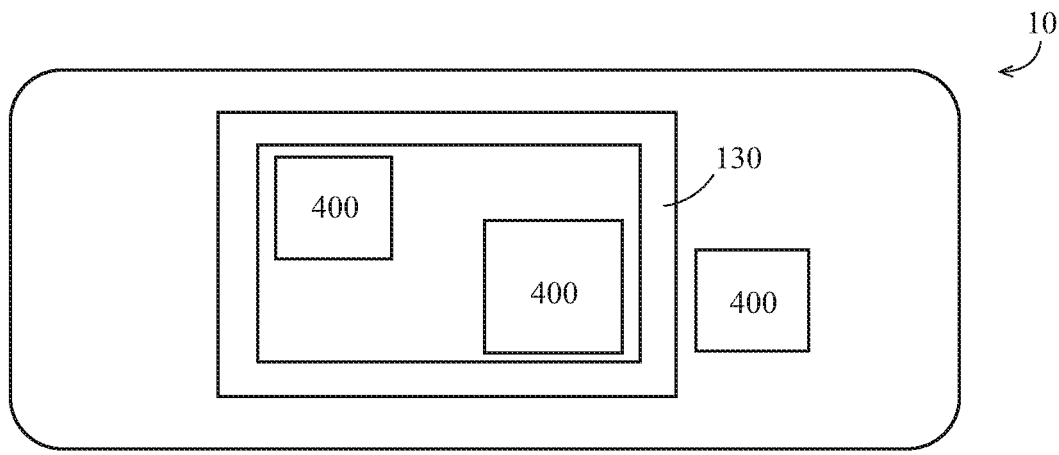
FIG. 8A and FIG. 8B are respectively schematic views illustrating configuration of a case assembly and heat sources according to a preferred embodiment of the present invention.
Figure 8B:
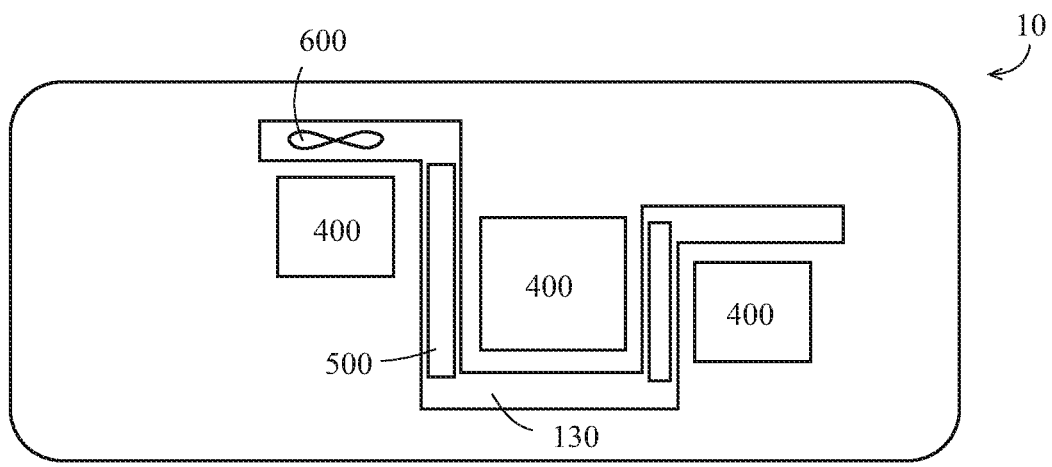

Please refer to FIG. 8A and FIG. 8B, which are schematic views of the inner side of the case assembly 10 according to preferred embodiments of the present invention. In the above preferred embodiments, the channel 130 may have a specific shape, e.g., a rectangle or U shape, thereby preventing the heat generated by the heat sources 400 from affecting each other or isolating the components susceptible to temperature according to the position of the heat sources 400. Optionally, the thermal isolator 500 may also have a length equal to that of the channel 130 and be continuously disposed in the channel 130, or have a length less than the length of the channel 130 and be discontinuously disposed in the channel 130. The case assembly 10 may further comprise a fan 600 disposed in the channel 130, and the fan 600 can blow air into or evacuate air from the channel 130, disperse the heat to reduce local high temperature, and guide the heat to a predetermined direction to be discharged.

Figure 9:
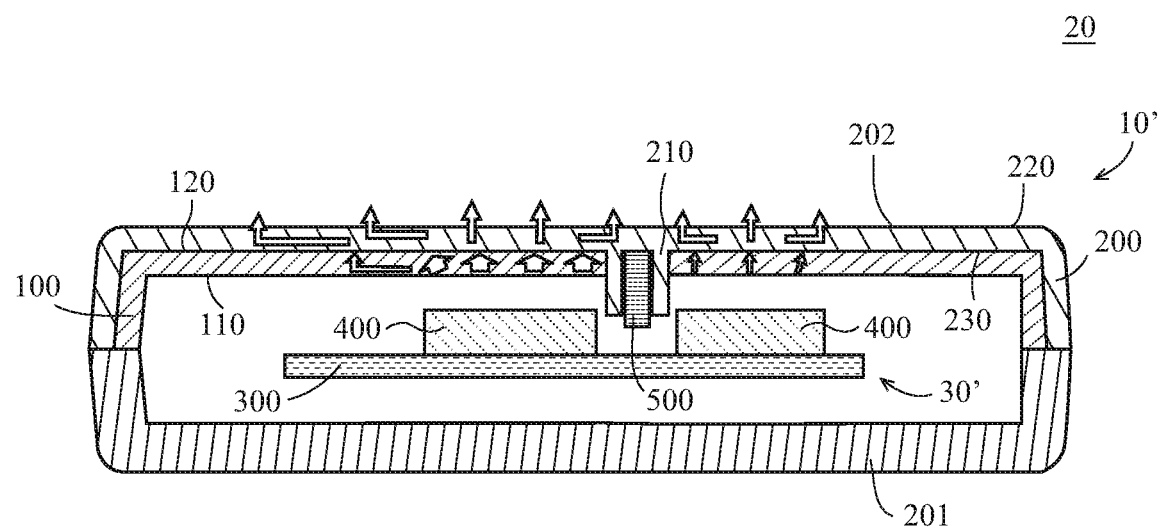
FIG. 9 is a schematic cross-sectional view of an electronic device according to a preferred embodiment of the present invention.

Please refer to FIG. 9, which is a schematic perspective view of an electronic device 20 according to another preferred embodiment of the present invention, and the electronic device 20 comprises a case assembly 10' and at least one heating source 30'. The electronic device 20 may comprise a display portion 201 and a back portion 202. The display portion 201 may comprise a display screen of a mobile phone and a tablet and a frame thereof, and the back portion 202 is opposite to the display portion 201 and may comprise a case assembly 10' and a frame (reference may be made to the case assembly 10 of the above embodiment for the technical content thereof). In this embodiment, the heating source 30' may be a chip, a microprocessor, a battery, or other components which are easy to generate heat in operation. The heating source 30' is disposed in the accommodating space formed by the display portion 201 and the back portion 202, and may be electrically connected with other elements in the accommodating space, such as a circuit board, an antenna, a sound emitting element or the like.

According to the above descriptions, the case assembly and the electronic device of the present invention can have the structural rigidity and strength of the metal cover, and have a channel to divide a plurality of thermal insulation areas, thus preventing the heat of a plurality of heat sources from affecting each other. In addition, heat dissipation structures such as a thermal barrier portion and/or a thermal isolator formed by a plastic cladding body may be further disposed to provide further thermal isolation for good heat dissipation management. The case assembly can be used in an electronic device as a component of the electronic device.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A case assembly, comprising:
a metal case, comprising an inner side and an outer side, the inner side is opposite to the outer side, and the metal case comprising a channel which is concavely disposed on the inner side to divide the inner side into a plurality of thermal insulation areas;
a plastic cladding body, disposed on the metal case, and completely covering the outer side of the metal case;
wherein the channel of the metal case is further penetrating through the outer side and the plastic cladding body comprises a thermal barrier portion which is disposed in the channel.

2. The case assembly according to claim 1, further comprising a fan, wherein the thermal barrier portion comprises a groove, the fan is disposed in the groove.

3. The case assembly according to claim 2, wherein the thermal barrier portion comprises a groove, and the thermal isolator is disposed in the groove.

4. The case assembly according to claim 1, wherein the thermal barrier portion is protruded from the inner side of the metal case.

5. The case assembly according to claim 1, further comprising a thermal isolator, wherein the thermal isolator is disposed in the thermal barrier portion of the plastic cladding body.

6. The case assembly according to claim 1, further comprising a thermal isolator, wherein the thermal isolator is disposed in the channel of the metal case.

7. The case assembly according to claim 1, further comprising a fan, wherein the fan is disposed in the channel of the metal case.

8. An electronic device, comprising:
a case assembly, comprising a metal case and a plastic cladding body, wherein the metal case comprises an inner side and an outer side, the inner side is opposite to the outer side, the metal case further comprises a channel which is concavely disposed on the inner side to divide the inner side into a plurality of thermal insulation areas, the plastic cladding body is disposed on the metal case, and completely covers the outer side of the metal case; and
a plurality of heat sources, corresponded to the plurality of thermal insulation areas on the inner side of the metal case respectively;
wherein the channel of the metal case is further penetrating through the outer side and the plastic cladding body comprises a thermal barrier portion which is disposed in the channel.

* * * * *